United States Patent
Tonehira et al.

(10) Patent No.: US 6,810,213 B2
(45) Date of Patent: Oct. 26, 2004

(54) OPTICAL MODULE AND OPTICAL TRANSCEIVER

(75) Inventors: Koichiro Tonehira, Yokohama (JP); Hiroshi Yamamoto, Yokohama (JP); Kenji Yoshimoto, Yokohama (JP); Michihide Sasada, Yokohama (JP); Tetsuya Aoki, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 569 days.

(21) Appl. No.: 09/788,218

(22) Filed: Feb. 19, 2001

(65) Prior Publication Data

US 2002/0051268 A1 May 2, 2002

(30) Foreign Application Priority Data

Oct. 30, 2000 (JP) .................................... 2000-334925

(51) Int. Cl.[7] ................................................. G02B 6/43
(52) U.S. Cl. ...................................... 398/135; 398/138
(58) Field of Search ........................... 385/28, 93, 24, 385/35, 92; 15/303; 257/623; 359/819; 360/77.12; 372/38.02

(56) References Cited

U.S. PATENT DOCUMENTS 5,848,211 A * 12/1998 Yang et al. ................... 385/93
5,917,625 A * 6/1999 Ogusu et al. ................. 385/24
6,618,406 B1 * 9/2003 Kaminishi ................ 372/38.02

* cited by examiner

*Primary Examiner*—Jason Chan
*Assistant Examiner*—David Payne
(74) *Attorney, Agent, or Firm*—Knoble Yoshida & Dunleavy

(57) ABSTRACT

To provide economical high-speed optical communications through an optical module a silicon substrate with a ball lens and semiconductor luminescence element mounted thereon, and a laser driver IC are provided. A silicon subassembly includes a silicon substrate with a pyramidal cavity etched into the substrate near its edge. A ball lens is precision-mounted in the pyramidal cavity by bonding it at multiple points. This provides a high-strength connection and a small, inexpensive silicon substrate. Also provided on the silicon substrate is a semiconductor luminescence element and a slit on the opposite side of the ball lens. The slit enables collimated light emitted from the ball lens to be optically coupled without being blocked or reflected by the substrate. The semiconductor luminescence element and its laser driver IC are placed in close proximity to each other, and ribbon wires are kept short (approximately 300 μm) to reduce signal line impedance mismatch for high-speed transmission.

9 Claims, 5 Drawing Sheets

FIG. 1
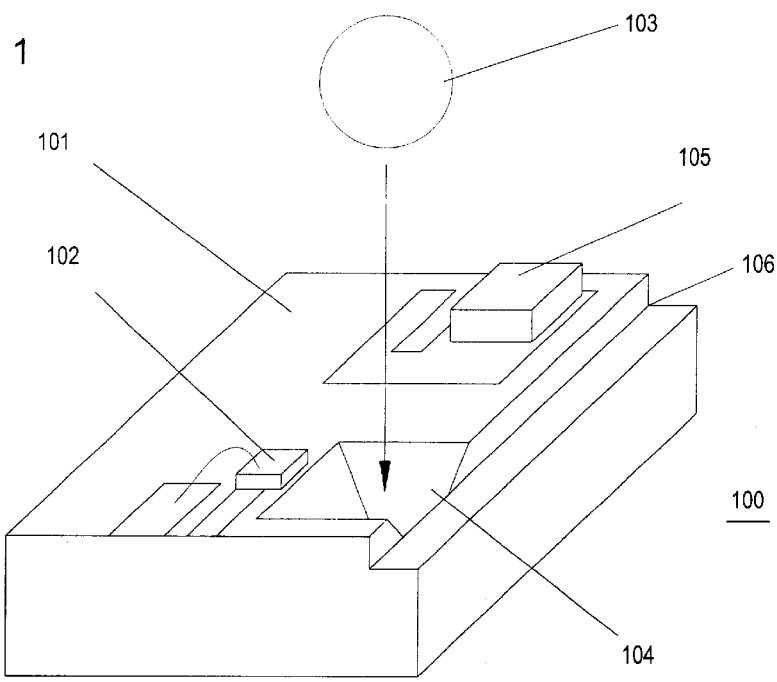
FIG. 2
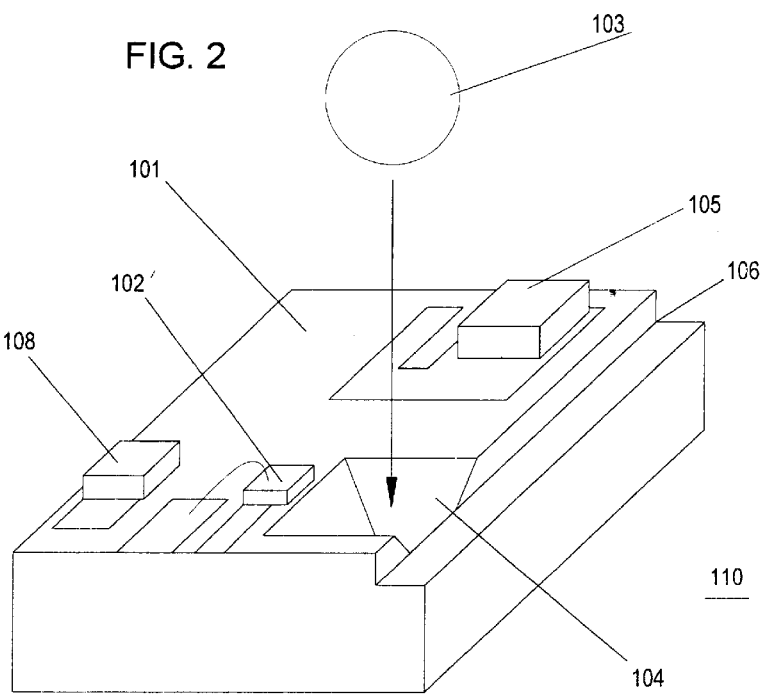
FIGS. 1 and 2
100-Silicon Substrate
101-Silicon Substrate
102'-102-Laser Diode
103-Ball Lens
104-Pyramidal Cavity
105-Thermistor
106-Slit
108-Photodiode
110-Silicon Assembly FIG. 3A
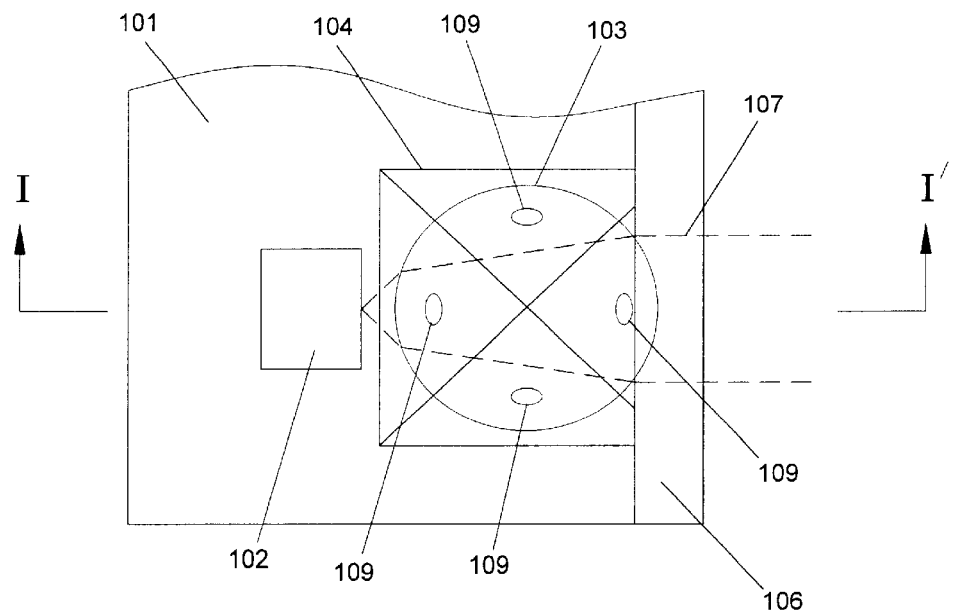
FIG. 3B
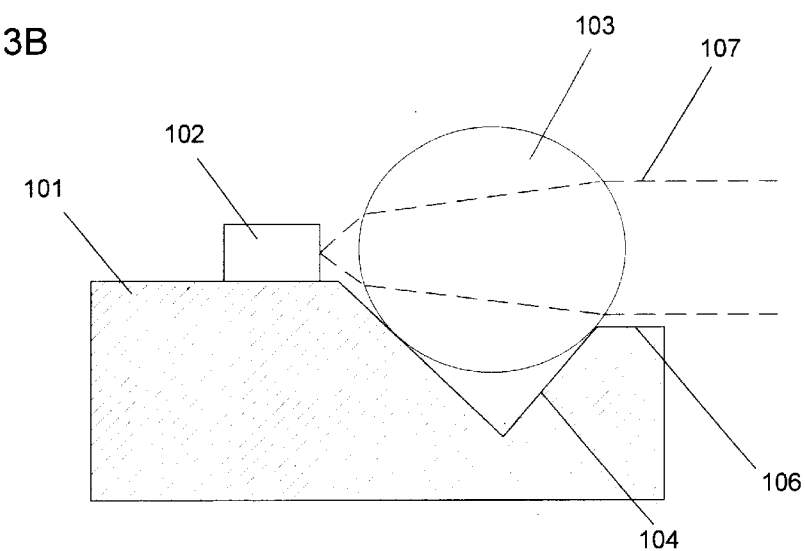
FIGS. 3A and 3B
101-Silicon Substrate
102-Laser Diode
103-Ball Lens
104-Pyramidal Cavity
105-Thermistor
106-Slit
107-Collimated Light Beam
109-Bonding Locations

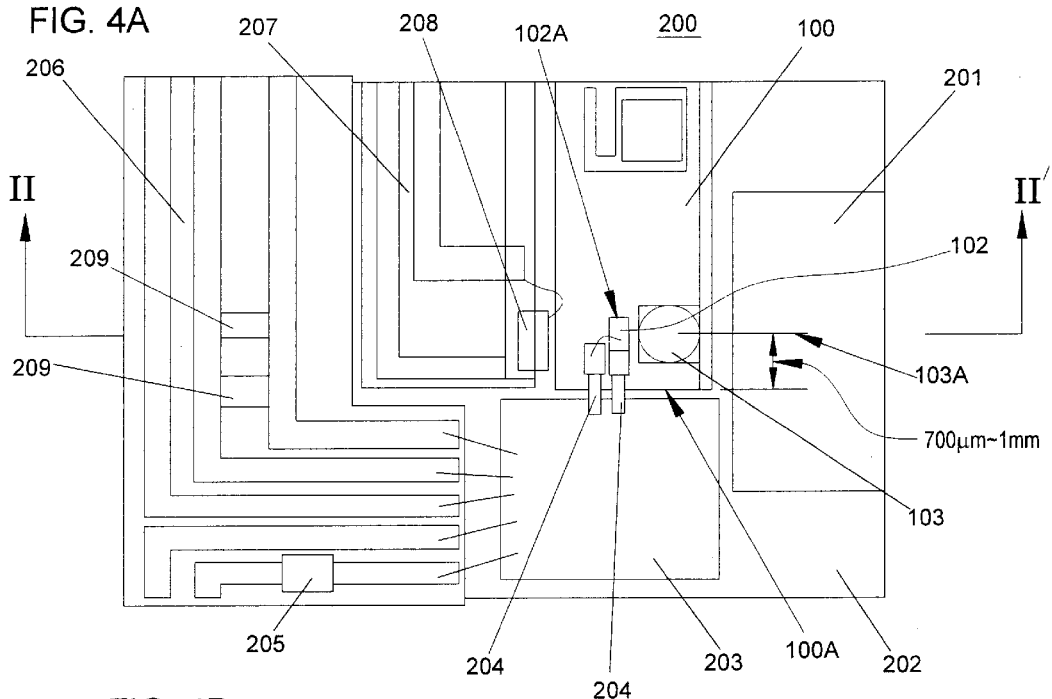
FIG. 4A
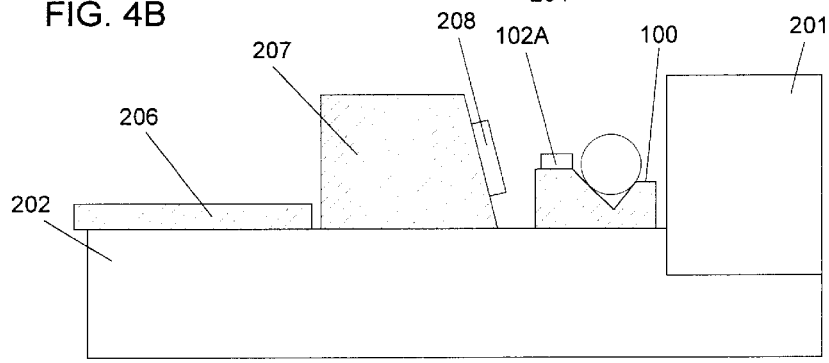
FIG. 4B
FIGS. 4A and 4B
100-Silicon Substrate
100A-Side
102-Laser Diode
102A-Exit Side
103-Ball Lens
103A-Optical Axis
200-Stem Assembly
201-Optical Isolator
202-Stem
203-Laser Driver IC
204-Ribbon Bonding Wires
205-Noise Suppression Element
206-Wiring-Board-Within-Stem
207-Block
208-Semiconductor Photodiode
209-Power Supply Bypass 200-Stem Assembly
301-Package
302-Wiring Board
303-Lead Pins
304-Ground Pin
305-Signal Pin
306-Fiber Ferrule
307-Fiber Holder
308-Holder-With-Lens 401-Optical Fiber
402-Photodiode Module
403-Limiting Amplifier
404-Optical Transceiver
405-Demultiplexer
406-Electrical Array Connector
407-Multiplexer
408-Optical Module

OPTICAL MODULE AND OPTICAL TRANSCEIVER

FIELD OF THE INVENTION

The present invention relates to an optical module and an optical transceiver, and in particular, to a semiconductor optical module appropriate for use in optical fiber communication, including a silicon substrate, a semiconductor optical element, and a ball lens.

BACKGROUND OF THE INVENTION

Recent growth in the demand for economical, high-traffic-volume optical fiber communication systems has encouraged the development of small, high-speed, low-cost optical modules. In particular, the use of passive alignment with semiconductor substrates has attracted significant attention because it uses low-cost materials and simplifies assembly. Passive alignment is a method in which a semiconductor substrate is etched to precise dimensional tolerances in order to eliminate complex alignments that would otherwise be required at the time of assembly. Another improvement entailed includes the laser IC driver for the semiconductor luminescence element (hereinafter, laser diode) inside the optical module package. This allows smaller optical modules that are capable of functioning with smaller input signals.

An example of a laser diode using a semiconductor substrate as described above may be found in Japanese pre-grant patent publication No. H9-222540. Here, a trapezoidal trench formed in a silicon substrate is configured to preclude the obstruction of light emitted from a luminescence element and collimated by a ball lens. An example of placing both the laser diode and its laser driver IC inside an optical module package may be found in Japanese pre-grant publication No. 2000-91695. Here, the laser diode and the laser driver IC are mounted on separate members to provide thermal isolation.

The above described prior art technologies, however, have problems. In the optical coupling device with a trapezoidal trench as described in JP pre-grant publication H9-222540, bonds are made at three points. This means that the pressure applied during bonding must be applied, not perpendicular to the plane of the substrate, but perpendicular to a virtual plane that includes the three bonding points. The direction in which the force is applied is at an angle to the plane of the silicon substrate results in the unevenly applied force, which leads to improper positioning and degraded bond strength.

In the optical module described in JP pre-grant publication No. 2000-91695, because the laser diode and the laser driver IC are mounted on separate members, it is difficult to place them close together, and they also complicate signal line (bonding wire) impedance matching. Also, because the input signal to the laser driver IC for the laser diode is a single phase (single-ended) signal, parasitic impedance introduced by the bond wires, etc. can degrade the input signal waveform. These factors tend to degrade high-speed transmission characteristics.

SUMMARY OF THE INVENTION

According to one aspect of the present invention, a laser diode and a ball lens are mounted on a semiconductor substrate, and the ball lens is mounted/bonded in a pyramidal cavity that is etched into the substrate. This configuration allows the pressure during bonding to be applied perpendicular to the surface of the substrate so as to achieve high-precision mounting and a high-strength bond. In addition, to prevent the blocking or reflection of collimated light being emitted from the ball lens, the light-emitting side of the pyramidal cavity where the ball lens is mounted is removed.

According to another aspect of the present invention, the signal input to the laser driver IC that drives the laser diode is a differential input. The input lines to the module are alternately arranged between ground pins and signal pins so as to facilitate signal path impedance-matching. Furthermore, rather than placing the laser diode and the ball lens in the middle of the silicon substrate, they are placed at the edge on a side that is perpendicular to the edge from which the light is emitted (a side parallel to the direction of emission). The above placement allows the laser diode and its driver IC to be placed closer to each other. This close placement allows the length of the wire ribbons between the laser driver IC and the lands of the laser diode to be a maximum of 300 µm, for minimizing impedance mismatch due to the wire ribbons in the signal path, and improving the high speed propagation characteristics.

BRIEF DESCRIPTION OF THE DRAWINGS

FIG. 1 is an isometric view of a first preferred embodiment of a subassembly of the optical module according to the present invention.

FIG. 2 is an isometric view of a second preferred embodiment of the subassembly of the optical module according to the present invention.

FIGS. 3A and 3B are detailed diagrams illustrating the ball lens and semiconductor luminescence element of the optical module of the first preferred embodiment according to the present invention.

FIGS. 4A and 4B are diagrams illustrating a subassembly of the optical module of the first preferred embodiment according to the present invention.

DETAILED DESCRIPTION OF THE PREFERRED EMBODIMENTS

Figure 5:
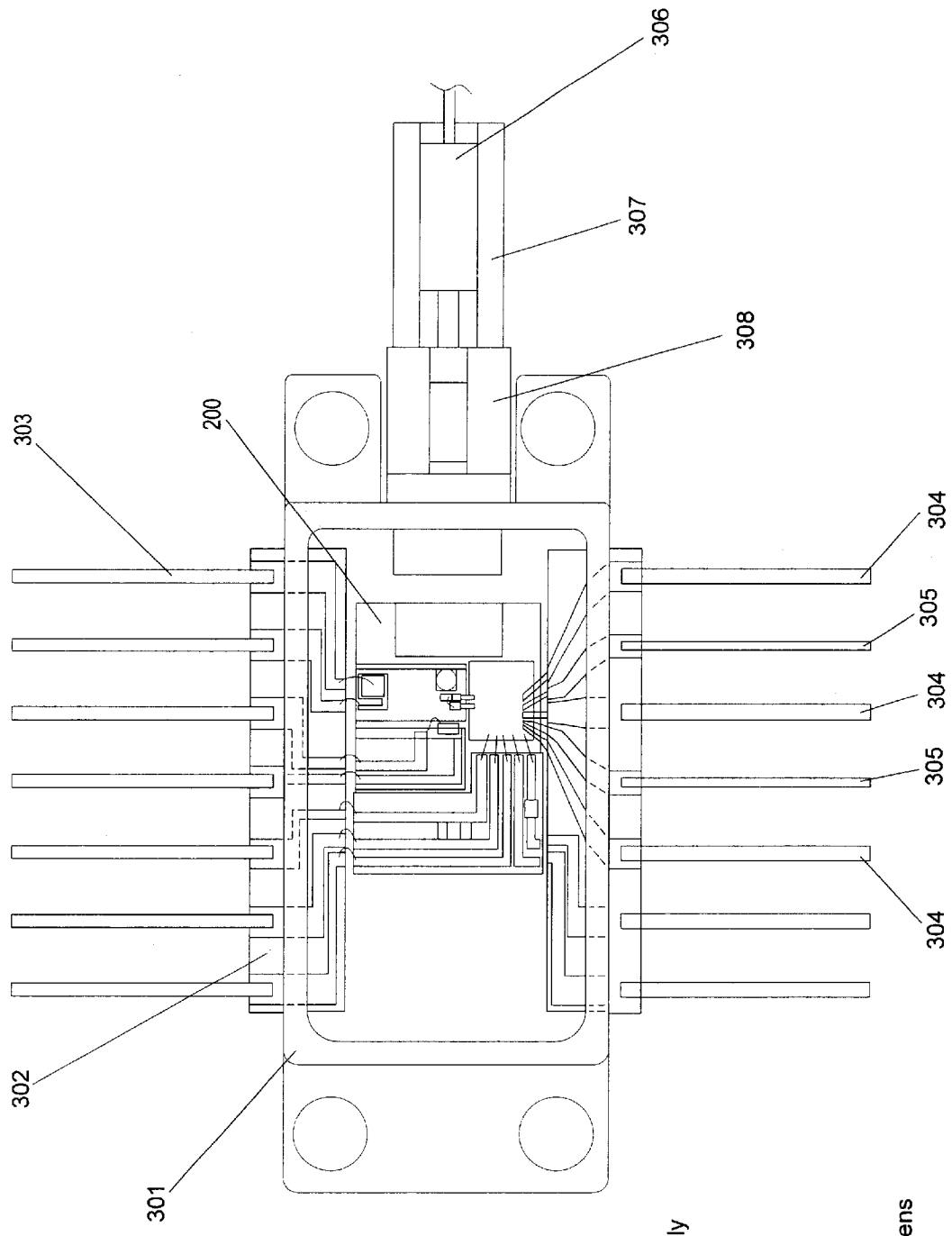
FIG. 5 is a plan view of the optical module in a preferred embodiment according to the present invention.

Preferred embodiments according to the present invention are described below, with reference to the figures. In general, the same reference numerals are used to the same components across the figures.

FIG. 1 is an isometric view of a diagram for illustrating an optical coupling in a first preferred embodiment of the optical module according to the present invention. As shown in FIG. 1, a silicon subassembly 100 comprises a silicon substrate 101, a semiconductor luminescence element (laser diode) 102, a ball lens 103, and a thermistor 105. The ball lens 103 is shown to be removed from the substrate to simplify the drawing. Formed in the silicon substrate 101 is a pyramidal cavity 104. A slit 106 is formed in a portion of the pyramidal cavity 104 by a dicing process. The slit 106 lowered one of the pyramidal cavity walls along an entire edge that is perpendicular to the optical axis at the emitting side. The laser diode 102 and the ball lens 103 are placed at the front of the silicon substrate 101 on the emitting side and on a side that is perpendicular to the emitting side.

Using an ordinary hot etch, the depth of the pyramidal cavity formed in the silicon substrate 101 is controlled to an accuracy of ±5 μm. With metallization provided on portions of the pyramidal cavity 104 and the ball lens 103 (metallization not shown in the drawing), the ball lens can be bonded to the cavity by application of pressure in a heated environment. Light emitted from the laser diode 102 is collimated or converted to substantially parallel rays by the passively-aligned ball lens 103. The thermistor 105 on the silicon substrate 101 measures the temperature of the laser diode 102 for controlling the amplitude of the laser diode drive current. Based on a reference value determined by measurements performed in advance, the thermistor 105 maintains a constant output.

The pyramidal cavity 104 as shown in FIG. 1 is a four-sided pyramidal cavity. It is known, however, that a three-sided pyramidal cavity can be formed by proper selection of the growth direction of the silicon substrate. That is, in the first preferred embodiment and other embodiments as well, a three-sided pyramidal cavity may also be used. In addition, a bonding adhesive could be used to make the bond between the pyramidal cavity 104 and the ball lens 103. This, of course, would eliminate the need for metallization.

FIG. 2 is an isometric view of a diagram illustrating an optical coupling in a second preferred embodiment of the optical module according to the present invention. The elements 101 through 106 are substantially identical to those of FIG. 1. Only the differences between the first and second preferred embodiments will be described. In the second preferred embodiment of a silicon assembly 110, a surface mounting-type semiconductor photodiode 108 for monitoring the optical output of a laser diode 102' is placed on the opposite side from the ball lens 103 across the laser diode 102'.

In the second preferred embodiment, the laser diode 102' is a "junction-down" device. Both the laser diode 102' and photodiode 108 have large tolerances for wafer thickness. If a "junction-up" device were used, there could be cases in which the photodiode 108 would not receive the light emitted from the back of the laser diode 102'. The second preferred embodiment function substantially the same as the first preferred embodiment except that the second preferred embodiment additionally monitors the operation of the laser diode 102'.

FIGS. 3A and 3B are detailed diagrams illustrating the semiconductor luminescence element (laser diode) 102 and the ball lens 103 of FIGS. 1 and 2. FIG. 3A is a plan view, and FIG. 3B shows a cross-sectional review at the section I–I' of FIG. 3A. The ball lens 103 is bonded to the pyramidal cavity 104 of the silicon substrate 101 at four bonding locations 109. The bonding is performed using adhesive, solder, or aluminum oxide. Light emitted from the laser diode 102 is converged by the ball lens 103 to form a collimated light beam 107 over the slit 106.

Referring to FIG. 3B, because a slit 106 is provided in the path of this collimated light beam 107 through the ball lens 103 from the laser diode 102 on the silicon substrate 101, it can be converged into a fiber by the next optical component without being blocked or reflected by the inner surface of the pyramidal cavity 104.

In the configuration of the second preferred embodiment, the pressure during bonding is applied perpendicular to the surface of the substrate so as to achieve highly precise mounting and a high-strength bond. In addition, the removal of the exit side of the pyramidal cavity where the ball lens is mounted prevents blocking or reflection of the collimated light that is emitted from the ball lens.

FIGS. 4A and 4B illustrate the construction of a stem subassembly of a preferred embodiment of the optical module according to the present invention. FIG. 4A is a plan view, while FIG. 4B illustrates a cross-sectional view at the section II–II' of FIG. 4A. The stem subassembly 200 includes a silicon substrate subassembly 100 and an optical isolator 201 on a stem 202 for preventing returned light, a laser driver IC 203 for driving a semiconductor luminescence element or laser diode 102, a wiring-board-within-stem 206, a semiconductor photodiode 208 for monitoring light output, and a block 207 for mounting the semiconductor photodiode 208 thereon. Electrical connections between the silicon substrate subassembly 100 and the laser driver IC 203 are made by ribbon bonding wires 204, which are approximately 300 μm long. The distance between the laser diode 102 and its driver IC (including leads) is approximately 600 μm. The diameter of the ball lens 103 is approximately 600 μm, and the distance between its optical axis and a side of the substrate perpendicular to the light emitting side parallel to the direction of emission is approximately 650 μm. A noise suppression element 205 and a power supply bypass capacitor 209 are also located on the wiring-board-within-stem 206. Copper-tungsten (CuW) is used as the material for the stem 202 because it has low thermal resistance and also has a coefficient of thermal expansion that is almost the same as that of the silicon substrate.

In the stem subassembly configuration, the distance between an optical axis 103A of the lense 103 and a side 100A that is perpendicular to the exit side 102A of the laser diode 102 and that is parallel to the optical axis 103A is made 1 mm or less and preferably less than 700 μm. This distance puts the laser driver IC 203 physically close to the laser diode 102, and reduces impedance mismatching that is caused by the signal line ribbon bonding wires. The configuration thus improves the high-speed transmission characteristics. The semiconductor photodiode 208 makes it possible to monitor the operation of the semiconductor luminescence element or laser diode 102.

FIG. 5 is a plan view or partial cross-section of a preferred embodiment of the optical module according to the present invention. A package 301 includes a module wiring board 302, lead pins 303, and a stem subassembly 200. Electrical connections between the module wiring board 302 and the stem subassembly 200 are made by wire bonding. The reason for implementing the subassembly on a stem is that it would be difficult to install the optical components with the required precision if they were installed directly on the bottom of the module package 301. The stem subassembly 200 is constructed with a dimensional variance as large as ±50 μm which is not considered high precision when working optical components. Once the stem subassembly 200 has been constructed as described above, it is acceptable for installation in the module package 301. Variances of this magnitude can be adjusted for on the fiber holder end.

The signal input to the stem subassembly 200 is configured as a differential input. The input signal lines are arranged in the following sequence of 'ground pin 304-signal pin 305-ground pin 304-signal pin 305-ground pin 304-'. This arrangement provides impedance matching for the input signal from the module wiring board 302 to the laser diode driver IC. Light emitted from the stem subassembly 200 is converged by a holder-with-lens 308 to be optically coupled to a fiber ferrule 306 that is secured in a fiber holder 307. In the preferred embodiment, impedance matching and good high-speed transmission characteristics are achieved by arranging the signal and ground lines such that each of the two signal lines of the differential input has a ground line on either side of it.

Figure 6:
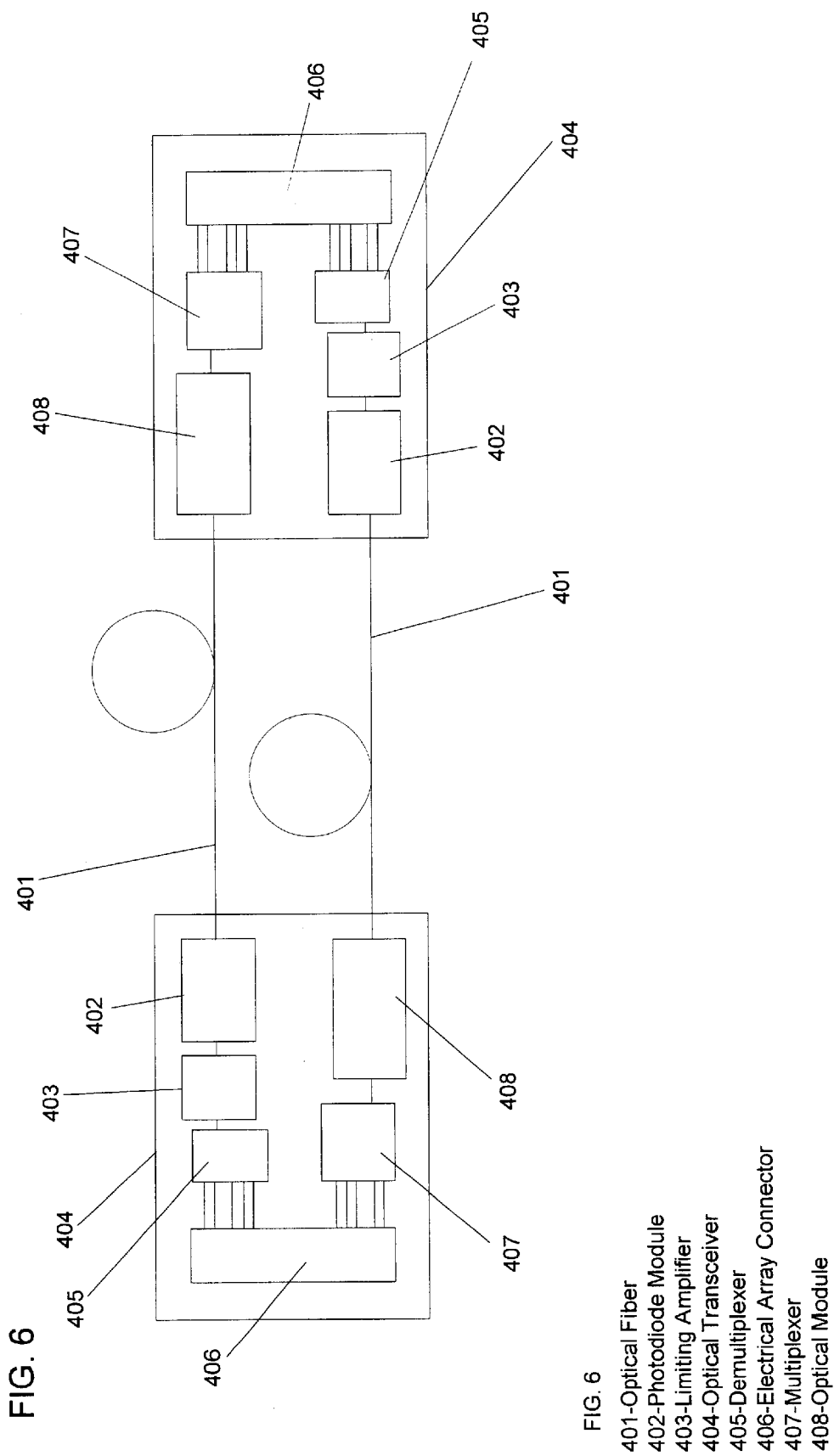
FIG. 6 is a block diagram of the optical transmission system in a preferred embodiment according to the present invention.

FIG. 6 is a block diagram for illustrating an optical transceiver and optical transmission system in another preferred embodiment according to the present invention. An optical transceiver 404 includes an optical module 408, a photodiode module 402, a limiting amplifier 403, a multiplexer 407, a demultiplexer 405, and an electrical array connector 406. An electrical signal from the optical communication system is input via the electrical array connector 406 to the optical transceiver 404, where it is multiplexed by a multiplexer 407. The multiplexed electrical signal is converted to light in the optical module 408, and transmitted at high speed over an optical fiber 401. This transmitted light is converted to an electrical signal by the photodiode module 402 of another optical transceiver. The resulting electrical signal is passed through the limiting amplifier 403 and demultiplexed by a demultiplexer 405. This demultiplexed signal is output through the electrical array connector 406 to the optical communication system.

By providing for precision-mounting of a semiconductor luminescence element (laser diode) and a laser driver IC in an optical module, the present invention provides an optical module with improved high-speed transmission characteristics.

What is claimed is:

1. An optical module comprising
   a luminescence element for emitting light;
   a lens located near said luminescence element for collimating the light emitted from said luminescence element, said lens having a light-entering portion and a light-exiting portion along an optical axis, the light entering into the light-entering portion and exiting from the light-exiting portion; and
   a semiconductor substrate for mounting said luminescence element and said lens thereon, said semiconductor substrate having a pyramidal cavity defined by a predetermined number of inner walls, wherein said lens is mounted in said pyramidal cavity, one of the inner walls defining a front cavity wall near the light exiting portion and having a front edge that is perpendicular to the optical axis, the front cavity wall being shorter along an entire portion of the front edge than others of the inner walls for substantially reducing interference of the light.

2. The optical module according to claim 1 wherein said luminescence element is mounted such that the optical axis thereof is positioned at least 1 mm away from a side perpendicular to a light-emission edge of said semiconductor substrate.

3. The optical module according to claim 2 wherein said luminescence element is mounted such that the optical axis thereof is positioned at least 700 μm away from a side perpendicular to a light-emission edge of said semiconductor substrate.

4. The optical module according to claim 2 wherein a module package includes a member, said luminescence element and a semiconductor driver for driving said luminescence element, said semiconductor substrate and said semiconductor driver placed on said member.

5. The optical module according to claim 2 wherein a package includes a luminescence element and a semiconductor driver for driving said luminescence element, wherein a signal input from said package to said semiconductor driver is a differential input, and a conductor adjacent to said differential input signal is a ground conductor.

6. The optical module according to claim 1 further comprising:
   a light receiving module;
   a limiting amplifier;
   a multiplexer; and
   a demultiplexer.

7. The optical module according to claim 1 wherein said pyramidal cavity has four of the inner walls.

8. The optical module according to claim 1 wherein said pyramidal cavity has three of the inner walls.

9. An optical transceiver comprising
   a light transmitting module;
   a light receiving module;
   a limiting amplifier;
   a multiplexer; and a
   demultiplexer;
   said light transmitting module having, within a package thereof, a semiconductor substrate, a luminescence element, a lens and a semiconductor driver for driving said luminescence element, wherein a signal input from a lead pin of said package to said semiconductor driver is a differential input, and a conductor adjacent to a conductor of said differential input signal is a ground conductor, said semiconductor substrate for mounting said luminescence element and said lens thereon, said semiconductor substrate having a cavity defined by a predetermined number of inner walls, wherein said lens is mounted in said cavity, one of the inner walls defining a front cavity wall near the light exiting portion and having a front edge that is perpendicular to an optical axis of said lens, the front cavity wall being shorter along an entire portion of the front edge than others of the inner walls for substantially reducing interference of the light.

* * * * *